United States Patent [19]

Imai et al.

[11] Patent Number: 5,338,704

[45] Date of Patent: Aug. 16, 1994

[54] SEMICONDUCTOR DEVICE AND METHOD OF MANUFACTURING THE SAME

[75] Inventors: Atsushi Imai; Tuyoshi Hishida, both of Kyoto, Japan

[73] Assignee: Rohm Co., Ltd., Kyoto, Japan

[21] Appl. No.: 970,372

[22] Filed: Nov. 2, 1992

[30] Foreign Application Priority Data

Nov. 15, 1991 [JP] Japan .................................. 3-300371

[51] Int. Cl.⁵ ............................................ H01L 21/60
[52] U.S. Cl. ..................................... 437/209; 437/211; 437/214; 437/217; 437/220
[58] Field of Search ............... 437/209, 211, 217, 220, 437/2, 3, 4, 214, 215

[56] References Cited

U.S. PATENT DOCUMENTS

| 4,209,358 | 6/1980 | Dileo et al. | 437/220 |
| 4,707,724 | 11/1987 | Suzuki et al. | 437/211 |
| 4,835,120 | 5/1989 | Mallik et al. | 437/220 |
| 5,045,151 | 9/1991 | Edell | 437/211 |
| 5,205,036 | 4/1993 | Yamazaki | 437/217 |

Primary Examiner—Tom Thomas
Assistant Examiner—Kevin M. Picardat
Attorney, Agent, or Firm—William H. Eilberg

[57] ABSTRACT

A conductive adhesive such as gold paste is coated and solidified on a lead provided on a frame for manufacture. Wire bonding between a semiconductor chip bonded to the frame and the lead provided thereon is effected between the semiconductor chip and a conductive adhesive layer solidified on the lead. It is thus possible to dispense with a conventional step of plating the frame (with gold) for effecting the wire bonding. In addition, it is possible to obtain reliable wire bonding irrespective of the kind of the base material of the frame or the surface roughness thereof. Further, it is possible to extremely simplify the process on the frame and save gold or like expensive material used as a plating material. Thus, it is possible to extremely reduce the cost of semiconductor device manufacture.

5 Claims, 4 Drawing Sheets

SEMICONDUCTOR DEVICE AND METHOD OF MANUFACTURING THE SAME

FIELD OF THE INVENTION

This invention relates to semiconductor devices and a method of manufacturing the same and, more particularly, to semiconductor devices and a method of manufacturing the same, which permit dispensing with plating of leads formed on a frame for the purpose of wire bonding between a semiconductor chip bonded to the frame and the leads, thus simplifying the process of manufacture and permitting the wire bonding irrespective of the surface state of the base material of the frame.

BACKGROUND OF THE INVENTION

Such semiconductor devices as ICs, transistors and light-emitting diodes are generally manufactured in the following process.

First, a semiconductor chip is bonded to a frame for manufacture (hereinafter referred to as frame), which is prepared by stamping a thin metal sheet to a predetermined shape. Then, wire bonding between leads formed to be integral with the frame at positions near the semiconductor chip and a bonding pad thereon is carried out by using a gold wire or the like. The eventual product thus obtained is then provided with a resin molding to enclose the semiconductor chip and the wire bonded region. Then, one removes the unnecessary portions of the frame and forms the leads. Then, after a mark formation step or an inspection step, each unit semiconductor device with leads projecting from a resin molding package portion is cut apart from the frame.

The frame is obtained from a thin sheet of iron plated with copper or a thin sheet of copper plated with nickel or silver. Further, since the wire bonding is made by using a gold wire, the lead portions for carrying out the wire bonding thereon are usually provided with gold plating in addition to the above plating. Such multiple layer plating on the base metal is done in order to prevent oxidization of the lead frame base layer. The silver plating as the outermost layer or further gold plating thereon is done to ensure the reliability of connection of the bonding wire to the leads.

As shown, in the prior art process of manufacture of semiconductor devices, it a prerequisite that the wire bonding to the leads is effected on gold plating (or sometimes on silver plating). Therefore, the entire frame has to be plated with nickel or silver and further with gold, if necessary. The process for such plating has been extremely complicated and increases the cost of the product.

In a further aspect, the wire bonding using a gold wire has to be done on a lead having a smooth surface. This means that the frame must be prepared with a minimum degree of smoothness. This has been a further cause of the increased cost of the product.

A primary object of the invention is to provide a semiconductor device, which has a novel wire bonding structure free from the conventional plating process that has been necessary for the gold wire bonding to leads on a frame.

Another object is to provide a method permitting efficient manufacture of such semiconductor device.

SUMMARY OF THE INVENTION

The semiconductor device according to the invention comprises a frame, a semiconductor chip bonded to a first portion of the frame, a wire connected the semiconductor chip and a second portion of the frame, and a resin molding package enclosing the semiconductor chip and the wire, wherein a solidified conductive adhesive layer is formed on the surface of the second frame portion with the wire connected thereto.

In other words, in the above semiconductor device, a semiconductor device bonded to a predetermined portion of a frame and a lead provided thereon are connected to each other by wire bonding and enclosed in a resin molding package.

A feature of the invention resides in that a wire is bonded between a conductive adhesive layer coated and solidified on the lead portion of the frame and the semiconductor chip.

A method of manufacturing a semiconductor device according to the invention comprises the steps of:

(1) coating and solidifying a conductive adhesive on a lead portion of a frame;

(2) bonding a semiconductor chip to another portion of the frame; and (3) bonding a wire to the semiconductor chip and the conductive adhesive solidified on the lead portion of the frame.

Another method of manufacturing a semiconductor device according to the invention comprises the steps of:

(1) coating a conductive adhesive on a chip bonding portion of a frame as well as on a lead portion of the frame;

(2) mounting the semiconductor chip on the chip bonding portion;

(3) thermally causing solidification of the conductive adhesive on the chip bonding region to secure the semiconductor chip in position while also causing solidification of the conductive adhesive on the lead; and (4) bonding a wire to the semiconductor chip and also to the conductive adhesive solidified on the lead portion.

With the semiconductor device according to the invention, the end of the bonding wire opposite the end bonded to the semiconductor chip is bonded not to the conventional plated lead but is bonded to the conductive adhesive coated and solidified on the lead. Such wire bonding is usually carried out as follows. The end of gold wire paid off a capillary member is melted to form a molten ball using a hydrogen torch. This molten ball is pressed against the semiconductor chip with an end of the capillary member, thus effecting the first bonding of an end of the gold wire to the semiconductor chip. Then the gold wire is paid off by moving the capillary member, and the end of the capillary member is urged against the lead to effect thermal fusion bonding of the gold wire to the lead, while at the same time breaking the wire by pulling the same, thus effecting the second bonding of the other end of the gold wire to the lead. Thus, even if the lead is not provided with gold plating, by controlling the urging force applied by the capillary member reliable second bonding of the gold wire to the lead can be obtained to ensure sufficient electric conduction.

Suitable conductive adhesive used may be gold paste, silver paste, solder with an increased melting point and so forth.

The gold paste, for instance, is obtained by mixing fine gold particles and a resin having adequate viscosity.

When heat is applied to such gold paste, the resin component is gassified, and the paste becomes a solid principally composed of gold. This manner of use of the gold paste as the conductive adhesive provides for satisfactory familiarity or fitness with respect to gold wire uses as the bonding wire, thus permitting improved reliability of wiring to be obtained.

As shown, the semiconductor device according to the invention permits dispensing with the plating process which has heretofore been necessary in the frame preparation stage. Thus, the process and equipment for manufacture can be greatly simplified compared to those in the prior art. In addition, it is possible to save expensive plating material such as gold and silver, thus permitting extreme reduction of the cost of manufacture.

Further, even if the surface of the base material of the frame is coarse, the conductive adhesive coated and solidified on on the frame is smooth, thus permitting reliable bonding irrespective of the kind of material or surface roughness of the frame material. Thus, the cost of the frame material itself may be reduced, which greatly contributes to the cost reduction of the product.

A preferred mode of bonding of a semiconductor chip to the frame is to use a common conductive adhesive to the chip and the lead and coat the adhesive on the chip bonding region and predetermined lead portions. In this case, the securement of the chip and the solidification of the adhesive coated on the lead can be effected at once by heating the system with the chip set on the chip bonding region. This mode of operation further simplifies the bonding of the semiconductor chip or wire bonding, which again greatly contributes to the cost reduction of the product.

As has been described in the foregoing, according to the invention reliable wire bonding between the semiconductor chip and the lead can be obtained while dispensing with silver or gold plating on the frame, which has heretofore been a conventional prerequisite for wire bonding. This is greatly beneficial in view of the obtainable material cost reduction and also reduction attributable to the simplification of the process and equipment of manufacture.

It is to be understood that any change or modification obvious to a person having ordinary knowledge in the art may be made without departing from the scope and spirit of the invention as claimed in the appended claims.

BRIEF DESCRIPTION OF THE DRAWINGS

FIGS. 1 to 5 illustrate the application of the invention to the manufacture of one kind of light-emitting diode, in which:

FIG. 1 is a view showing a succession of frames carried by a frame carrier;

FIG. 2 is a view showing a frame after coating a conductive adhesive coated thereon;

FIG. 3 is a view showing the frame after bonding a semiconductor chip thereto;

FIG. 4 is a view showing the frame after effecting wire bonding; and

FIG. 5 is a view showing the frame carrier after the step of providing a resin molding package and the step of cutting away unnecessary lead portions; and FIGS. 6 and 7 illustrate the application of the invention to the manufacture of a different kind of semiconductor device, in which:

FIG. 6 is a view showing frame regions requiring the coating of a conductive adhesive; and FIG. 7 is a view showing a structure obtained after a chip and a wire bonding step.

DETAILED DESCRIPTION OF THE PREFERRED EMBODIMENTS

FIGS. 1 to 5 show an example of applying the invention to a process of efficiently manufacturing light-emitting diodes.

Figure 1:
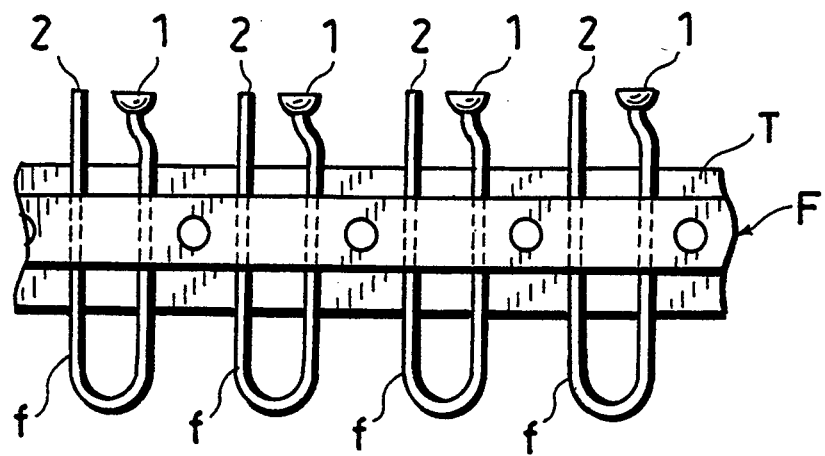

FIG. 1 shows a continuous strip comprising a tape-like carrier T carrying U-shaped unit frames f at constant spacing. The continuous strip serves as a frame F for manufacturing light-emitting diodes.

Each U-shaped unit frame f is obtained by cutting a needle-like metal member to a predetermined length, forming one end of the cut needle-like member into a cup 1 using a press, and then bending the needle-like member into a U-shaped form using a forming machine. In this process, it is important that even if the material needle-like member is provided with rust-proof plating, the member is cut to a predetermined length, so that the base material (i.e. ground metal) is exposed at the ends of the U-shaped unit frame f.

If the prior art method of making semiconductor devices is to be adopted, it is necessary to carry out plating with nickel, silver or gold at the ends of the U-shaped unit frame f, where the base material is exposed. It is not feasible to adopt such plating for the method of the present invention.

Figure 2:
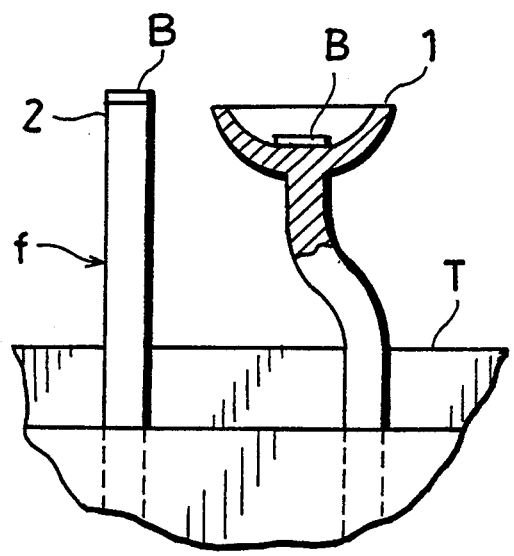

According to the invention, a conductive adhesive B comprising gold paste or the like is applied by means of transfer printing on both the inner surface of the cup 1 and the other end 2 of the unit frame f, as shown in FIG. 2.

Figure 3:
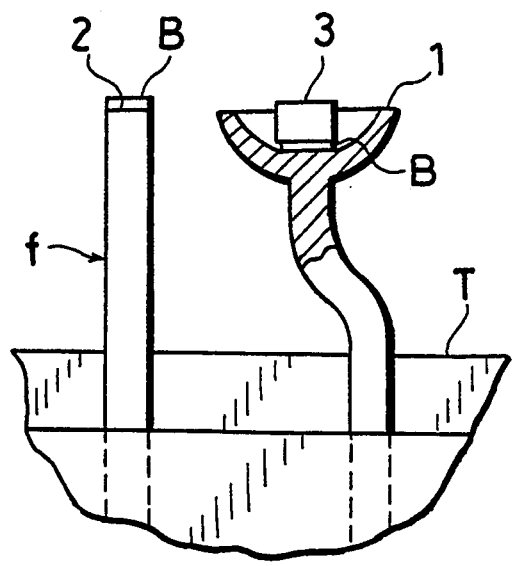
Figure 4:
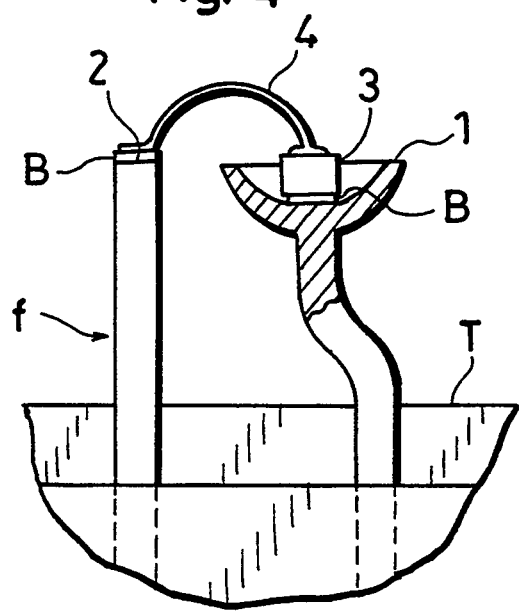

Then, as shown in FIG. 3, a diode chip 3 is set on and attached to the inner surface of the cup 1 before the conductive adhesive B is dried.

Then, the conductive adhesive B intervening between the diode chip 3 and the cup 1 and that coated on the end 2 are dried and solidified by introducing the unit frame f into a drying or heating furnace. In this way, the conductive bonding of the diode chip 3 to the cup 1 is completed, while at the same time a solid conductive adhesive layer principally composed of gold is formed on the end 2.

Then, as shown in 4, wire bonding between the diode chip 3 and the end 2 is carried out using a gold wire 4. Usually, first bonding is carried out with respect to the diode 3, and second bonding is carried out with respect to the end 2.

Although not shown, in carrying out the second bonding a capillary member is pressed with a predetermined force against the end 2. To this end, the neighborhood of the end 2 of the unit frame f has to be clamped with a clamp or the like so that the applied force can be supported.

Since the second bonding is carried out with respect to the end 2, the gold wire 4 can be reliably bonded to the end 2 under thermal compression by controlling the force applied by the capillary member.

Figure 5:
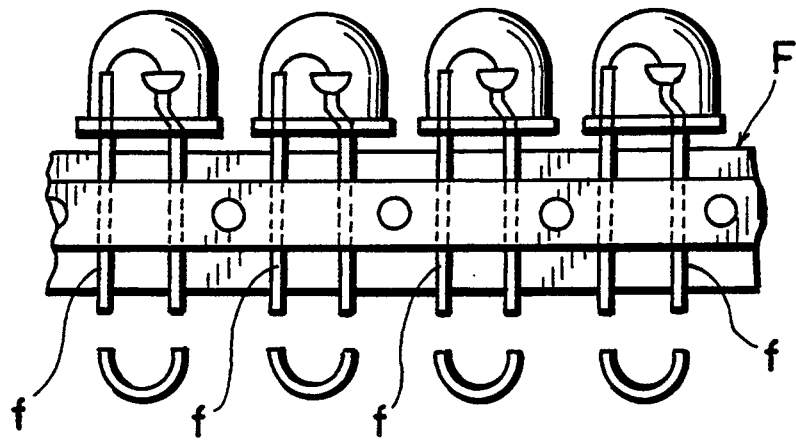

After the chip bonding and wire bonding, a transparent or opaque resin package is formed to enclose the cup 1 and the other end 2 of the unit frame f, as shown in FIG. 5. Also, a U-shaped lower end portion of the unit frame f is cut away, as shown in FIG. 5.

It is to be appreciated that when the invention is applied to the above specific process of manufacturing light-emitting diodes, there is no need for carrying out any particular plating on the unit frame f before performing the wire bonding. This means that it is sufficient for the unit frame f to be provided with rust-proof plating only.

While the above example concerns the application of the invention to a specific process of manufacturing light-emitting diodes, the invention can of course be applied as well to all semiconductor devices produced through a chip and wire bonding process.

Figure 6:
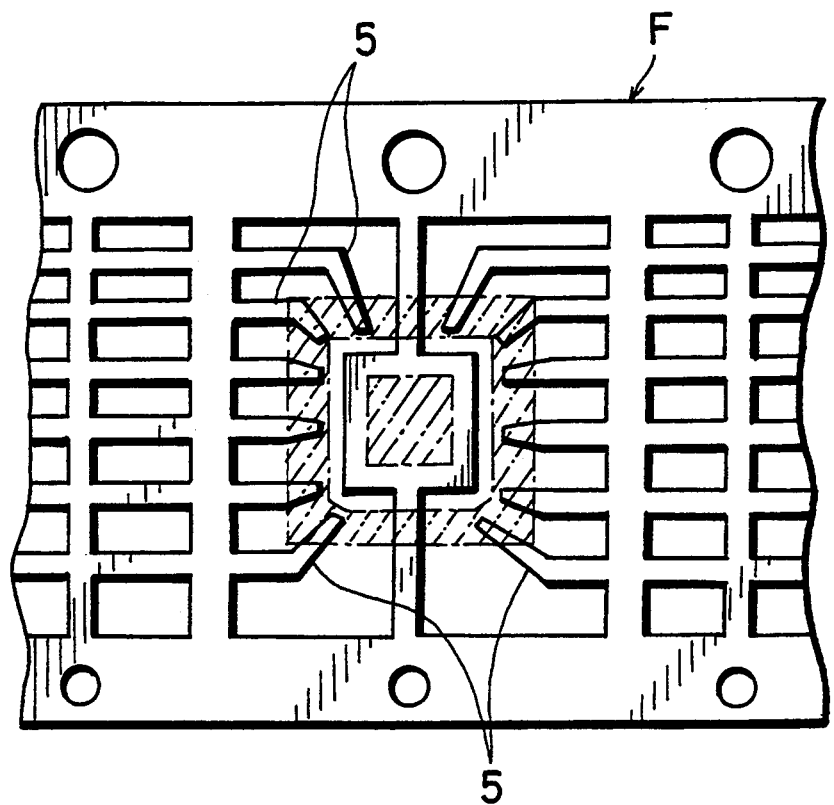
Figure 7:
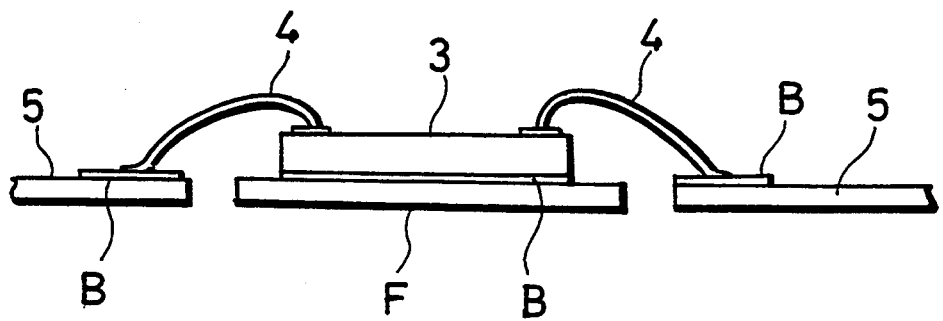

FIGS. 6 and 7 show an example of application of the invention to the manufacture of ICs using a frame F.

In this example, a conductive adhesive such as gold paste is coated on a chip bonding region (island) and end portions of a plurality of leads 5 located around the chip bonding region. In FIG. 5, the regions to be coated with the adhesive in this example are shaded. The adhesive may be coated conveniently by a conventional method such as a transfer process or a mimeographic printing process.

Then, a semiconductor chip 3 is set on and attached to the chip bonding section, and then the conducive adhesive is solidified by introducing the frame F in a drying furnace.

As a result, the semiconductor chip 3 is secured to the chip bonding region, and a conductive adhesive layer B principally composed of gold is formed on an end portion surface of each lead 5, as shown in FIG. 7.

Subsequent wire bonding may be done in the same way as previously described. Specifically, a gold wire 4 is bonded by first bonding to the bonding pad on the semiconductor chip 3, and the other end of the gold wire is bonded by second bonding to each lead 5 at the solidified conductive adhesive layer formed thereon.

As has been described in the foregoing, according to the invention it is possible to dispense with any plating process which should otherwise be carried out on the frame before the wire bonding. This is greatly advantageous economically in that the omission of a plating step saves the plating material cost while simplifying the structure of the manufacturing apparatus.

Further, highly reliable wire bonding is attainable without carrying out any plating irrespective of the surface roughness of the frame or of the material thereof. The cost of preparation of the frame itself thus can be greatly reduced, which is again a great economical advantage.

Of course, the scope of the invention is not limited by the above embodiments.

In the embodiments described above, a common conductive adhesive is used for bonding the semiconductor chip to the frame and for coating the lead However, this is by no means limiting.

In other words, the chip bonding step may be performed separately from the step of applying a conductive adhesive to each lead. In addition, different conductive adhesives may be used, if necessary, in these steps. Further, the application of the conductive adhesive to the leads may be done in advance at the time of preparing the frame.

What is claimed is:

1. A method of manufacturing a semiconductor device by using a frame which has at least one chip bonding portion for mounting a semiconductor chip, the frame further having at least one lead portion, the semiconductor device including a wire having a first end for connection to the semiconductor chip and a second end for connection to the lead portion of the frame, the method comprising the steps of:
   (1) applying a layer of conductive adhesive to the lead portion of the frame;
   (2) solidifying the conductive adhesive layer on the lead portion of the frame; and
   (3) bonding the second end of the wire to the solidified conductive adhesive layer on the lead portion of the frame.

2. The method according to claim 1, wherein the first end of the wire is bonded to the semiconductor chip in a first bonding step, whereas the second end of the wire is bonded to the solidified conductive adhesive layer on the lead portion of the frame in a second bonding step.

3. The method according to claim 1, wherein the semiconductor chip is bonded to the chip bonding portion of the frame by another layer of conductive adhesive applied to the chip bonding portion.

4. The method according to claim 1, wherein the conductive adhesive is a gold paste obtained by mixing fine gold particles with a fluid resin.

5. The method according to claim 1, wherein the wire is made of gold.

* * * * *